(12) United States Patent
Mulckhuyse et al.

(10) Patent No.: US 8,049,865 B2
(45) Date of Patent: Nov. 1, 2011

(54) LITHOGRAPHIC SYSTEM, DEVICE MANUFACTURING METHOD, AND MASK OPTIMIZATION METHOD

(75) Inventors: Wouter Frans Willem Mulckhuyse, Bussum (NL); Patricius Aloysius Jacobus Tinnemans, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 1136 days.

(21) Appl. No.: 11/522,533

(22) Filed: Sep. 18, 2006

(65) Prior Publication Data
US 2008/0068569 A1    Mar. 20, 2008

(51) Int. Cl.
*G03B 27/32* (2006.01)
*G03B 27/42* (2006.01)
*G03B 27/54* (2006.01)
*G06F 27/50* (2006.01)

(52) U.S. Cl. ............. 355/67; 355/53; 355/77; 716/53; 716/54; 716/55

(58) Field of Classification Search ............... 355/53, 355/67, 77; 700/121; 716/19; 378/34; 250/492.2, 250/492.22
See application file for complete search history.

(56) References Cited

U.S. PATENT DOCUMENTS

| | | | |
|---|---|---|---|
| 4,879,605 A | 11/1989 | Warkentin et al. | |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,727,977 B2 | 4/2004 | Butler | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |

(Continued)

FOREIGN PATENT DOCUMENTS
CN    1551246 A    12/2004
(Continued)

OTHER PUBLICATIONS

Notification of Reasons for Refusal mailed Sep. 28, 2010 for Japanese Patent Application No. 2007-240425, 3 pgs.

(Continued)

*Primary Examiner* — Edward Glick
*Assistant Examiner* — Colin Kreutzer
(74) *Attorney, Agent, or Firm* — Sterne, Kessler, Goldstein & Fox P.L.L.C

(57) ABSTRACT

A lithographic system comprises an array of individually controllable elements, a projection system, datapath hardware, and a conversion system. The array of individually controllable elements is capable of modulating a radiation beam. The projection system is configured to project the modulated radiation beam onto a target portion of a substrate. The datapath hardware converts an input pattern file into a control signal for controlling the array of individually controllable elements. The conversion system is configured to convert a requested device layout pattern into an input pattern file for the datapath hardware. The input pattern file is a spatial-frequency-restricted representation of the requested device layout pattern.

18 Claims, 6 Drawing Sheets

U.S. PATENT DOCUMENTS

| | | | |
|---|---|---|---|
| 6,811,953 B2 | 11/2004 | Hatada et al. | |
| 6,888,616 B2 | 5/2005 | Cooper et al. | |
| 6,934,421 B2 | 8/2005 | Gindele et al. | |
| 7,239,735 B2 | 7/2007 | Nozaki | |
| 7,338,752 B2 | 3/2008 | No et al. | |
| 7,403,265 B2 * | 7/2008 | Tinnemans et al. | 355/67 |
| 7,423,730 B2 | 9/2008 | Van Schothorst et al. | |
| 7,423,732 B2 | 9/2008 | Lipson et al. | |
| 7,618,751 B2 | 11/2009 | Sandstrom et al. | |
| 7,864,295 B2 | 1/2011 | Tinnemans et al. | |
| 2002/0172431 A1 | 11/2002 | Atkins et al. | |
| 2004/0041104 A1 | 3/2004 | Liebregts et al. | |
| 2004/0051855 A1 | 3/2004 | Cooper et al. | |
| 2004/0130561 A1 | 7/2004 | Jain | |
| 2004/0251430 A1 | 12/2004 | Sandstrom | |
| 2005/0007572 A1 | 1/2005 | George et al. | |
| 2005/0018164 A1 * | 1/2005 | Hansen | 355/69 |
| 2005/0157285 A1 | 7/2005 | Schothorst et al. | |
| 2005/0219502 A1 * | 10/2005 | Sandstrom et al. | 355/77 |
| 2006/0132746 A1 | 6/2006 | Baselmans et al. | |
| 2006/0219502 A1 | 10/2006 | de la Fuente-Farias | |
| 2008/0143982 A1 * | 6/2008 | Troost et al. | 355/53 |
| 2009/0011345 A1 * | 1/2009 | Tinnemans et al. | 430/30 |
| 2011/0043778 A1 | 2/2011 | Tinnemans et al. | |

FOREIGN PATENT DOCUMENTS

| | | |
|---|---|---|
| EP | 0 794 552 A2 | 9/1997 |
| EP | 1 482 375 A2 | 12/2004 |
| EP | 1 491 960 A2 | 12/2004 |
| EP | 1 517 188 A2 | 3/2005 |
| JP | 2000-58440 A | 2/2000 |
| JP | 2001-175857 A | 6/2001 |
| JP | 2002-367900 A | 12/2002 |
| JP | 2003-331284 A | 11/2003 |
| JP | 2003-331285 A | 11/2003 |
| JP | 2004-356633 A | 12/2004 |
| JP | 2006-135332 A | 5/2006 |
| WO | WO 98/33096 | 7/1998 |
| WO | WO 98/38597 | 9/1998 |
| WO | WO 02/073288 A1 | 9/2002 |
| WO | WO 2004/111701 A1 | 12/2004 |
| WO | WO 2005/047955 A1 | 5/2005 |
| WO | WO 2005/081070 A1 | 9/2005 |

OTHER PUBLICATIONS

English-language Abstract of Chinese Publication No. CN 1551246 A, published Dec. 1, 2004; 1 page.

Englsh Translation of Second Office Action directed to related Chinese Patent Application No. 200610073329.6, issued on Dec. 7, 2010 from the State Intellectual Property Office of People's Republic of China; 2 pages.

U.S. Notice of Allowance mailed Mar. 19, 2008, directed to related U.S. Appl. No. 11/093,259, filed Mar. 30, 2005; 8 pages.

U.S. Notice of Allowance mailed Oct. 7, 2010, directed to U.S. Appl. No. 12/166,837, filed Jul. 2, 2008; 8 pages.

Non-Final Rejection mailed Sep. 21, 2007 for U.S. Appl. No. 11/093,259, 7 pgs.

Translation of Japanese Notice of Reasons for Refusal for Patent Application No. 2006-089853 mailed Jan. 27, 2009, 3 pgs.

English Abstract for Japanese Publication No. 2006-527418 T published Nov. 30, 2006, 2 pgs.

Notification of Reasons for Refusal dated Mar. 29, 2007, for KR Patent Application No. 10-2006-0029223, 3 pgs.

Australian Search Report, dated Apr. 27, 2007, for Singapore Application No. SG 200602145-5, 9 pgs.

European Search Report and Written Opinion for EP 06 251 482.3 mailed Sep. 18, 2007, 18 pgs.

English Abstract of Japanese Publication No. 2002-367900 A published Dec. 20, 2002, 1 pg.

English Abstract of Japanese Publication No. 2003-331285 A published Nov. 21, 2003, 1 pg.

Non-Final Rejection mailed Jun. 22, 2010 for U.S. Appl. No. 12/166,837, 8 pgs.

* cited by examiner

LITHOGRAPHIC SYSTEM, DEVICE MANUFACTURING METHOD, AND MASK OPTIMIZATION METHOD

BACKGROUND

1. Field of the Invention

The present invention relates to a radiation pulse energy control system, a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

A chip layout tool or similar design utility can be used to define a target device layout pattern that a user wishes to generate on a substrate. The output or "layout" file from such a utility will normally define the target device pattern in terms of the structures it contains. For example, the layout file can be in the GDSII format.

In a maskless system, the layout file can form part of the input to a datapath. The datapath can comprise a series of data manipulation devices configured to calculate how a patterning system should be actuated in order to form a dose pattern on the substrate suitable for generating the target device pattern by subsequent processing of the exposed substrate.

However, the target device layout pattern defined in the layout file has infinitely sharp edges and does not take into account the limited (spatial) frequency response of the projection system, which acts as a kind of low-pass filter (in the spatial domain). In other words, the data in the layout file is not bandwidth-limited in the same way as the output from the projection system and contains information (mainly high spatial frequency data) that cannot be reproduced by the projection system.

If not allowed for, the abovementioned mismatch between the frequency content of the layout file and the frequency response of the projection system leads to errors in the dose pattern formed. One way in which these errors can be reduced is by modifying the layout file to incorporate corrective features, also known as "optical proximity corrections" (OPCs).

The OPCs can be derived by theoretical calculation of the dose pattern (or "aerial image") expected for a given mask layout exposed through a given projection system. OPCs can then be inserted in the mask layout to correct for errors that are seen to occur due to the low-pass characteristics of the projection system.

However, the dose pattern achieved in a maskless system using the layout and OPCs as input can differ significantly from the dose pattern that would result from using a mask construction based on the same layout and OPCs with a corresponding mask-based system. This can cause a problem, for example, where a maskless system is used to screen candidate layouts for use in a mask-based system. A layout that works well as input for the maskless system may not work so well when used as a mask in a mask-based system.

Therefore, what is needed is a system and method that better handles bandwidth limitations of a projection system.

SUMMARY

In one embodiment of the present invention, there is provided a lithographic system comprising an array of individually controllable elements, a projection system, datapath hardware, and a conversion system. The array of individually controllable elements is capable of modulating a radiation beam. The projection system is configured to project the modulated radiation beam onto a target portion of a substrate. The datapath hardware converts an input pattern file into a control signal for controlling the array of individually controllable elements. The conversion system is configured to convert a requested device layout pattern into an input pattern file for the datapath hardware. The input pattern file is a spatial-frequency-restricted representation of the requested device layout pattern.

According to another embodiment of the present invention, there is provided a device manufacturing method comprising the following steps.

Modulating a radiation beam using an array of individually controllable elements. Projecting the modulated radiation beam onto a target portion of a substrate using a projection system. Converting an input pattern file into a control signal for controlling the array of individually controllable elements using datapath hardware. Converting a requested device layout pattern into a spatial-frequency-restricted representation of the requested device layout pattern and using the spatial-frequency-restricted representation of the requested device layout pattern as the input pattern file for the datapath hardware.

According to a further embodiment of the present invention, there is provided a mask optimization method comprising the following steps. Calculating a dose pattern that would be projected onto a substrate by a mask-based lithographic apparatus using a given candidate mask pattern as the mask. Using the calculated dose pattern as an input for datapath hardware in a maskless lithographic apparatus. The datapath hardware is configured to convert a dose pattern into a control signal for controlling an array of individually controllable elements. Modulating a radiation beam using the array of individually controllable elements. Projecting the modulated radiation beam onto a target portion of the substrate in order to form an exposed substrate. Processing the exposed substrate to form a device. Testing the device to evaluate its performance. Repeating the above steps for a series of candidate mask patterns and selecting an optimal candidate mask pattern from a comparison of the results of the testing steps.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
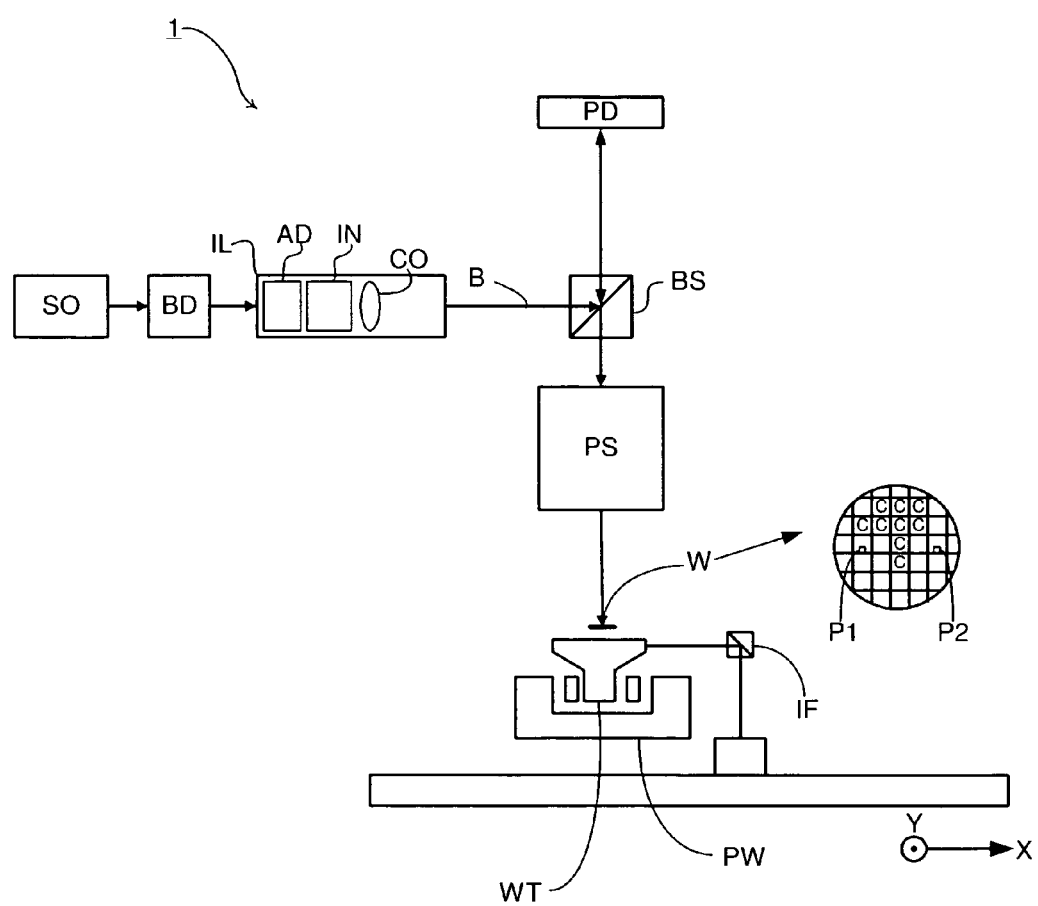
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 μm, at least 100 μm, at least 200 μm, at least 300 μm, at least 400 μm, at least 500 μm, or at least 600 μm. Alternatively, the thickness of the substrate can be at most 5000 μm, at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
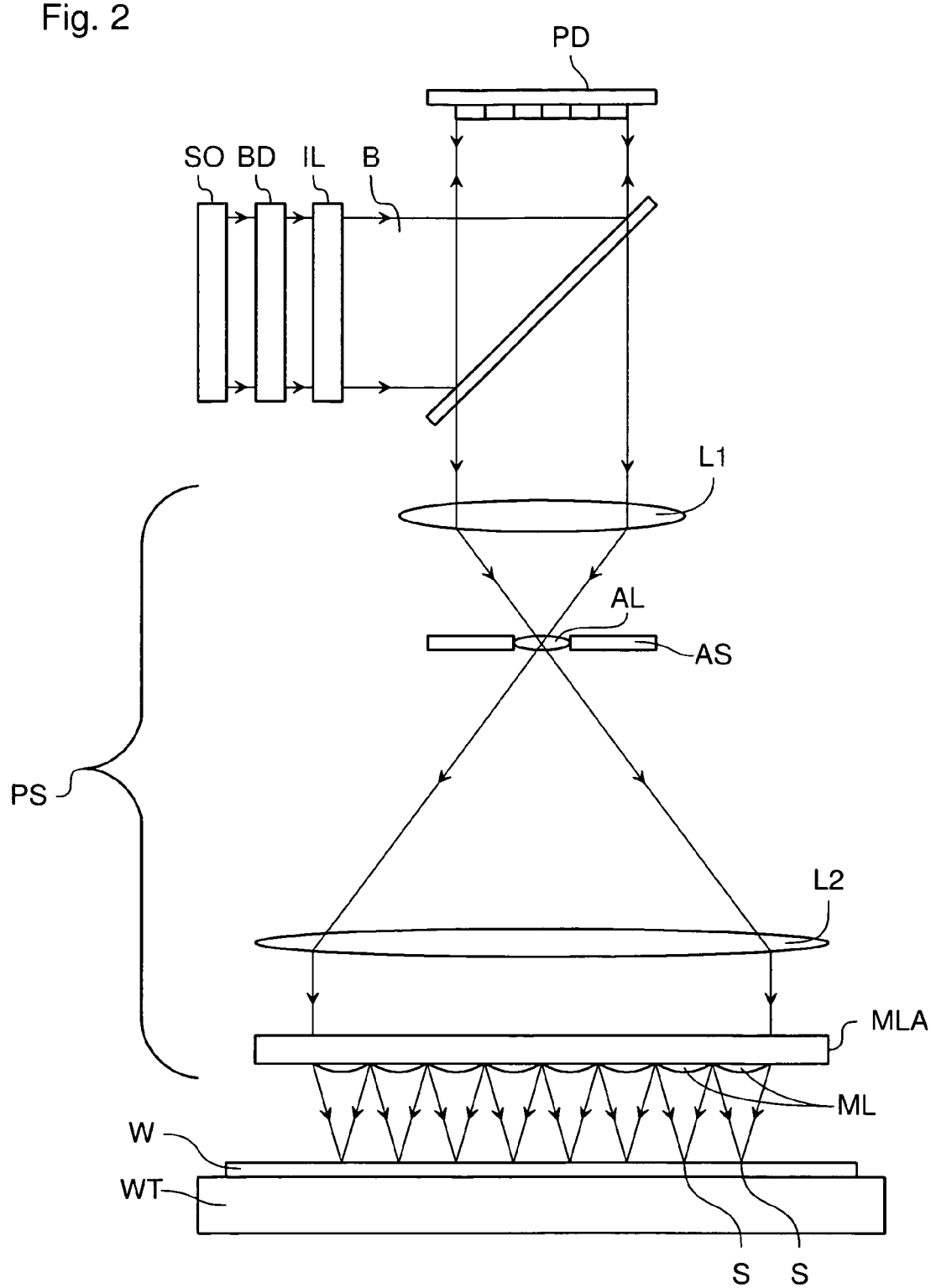

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
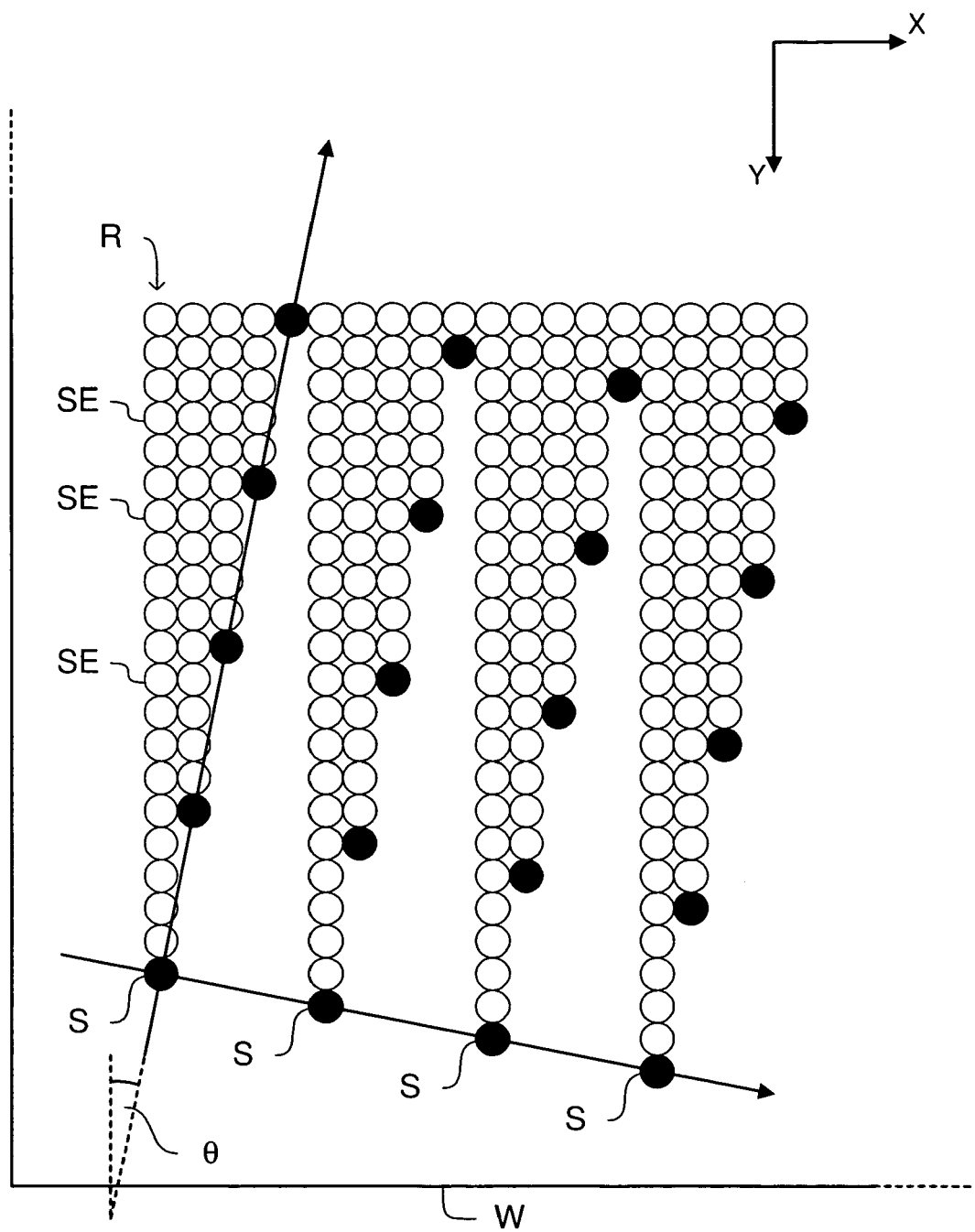
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle θ can be at most 20°, at most 10°, at most 5°, at most 3°, at most 1°, at most 0.5°, at most 0.25°, at most 0.10°, at most 0.05°, or at most 0.01°. Alternatively, the angle θ is at least 0.001°.

Figure 4:
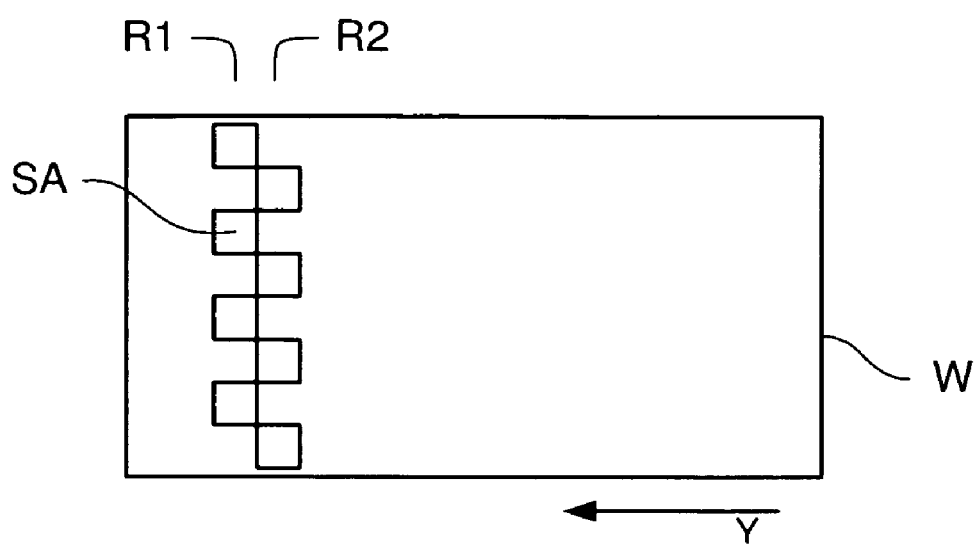
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

The projection system PS can be bandwidth limited due to diffraction effects. In effect, the image produced by the projection system PS on the substrate W is a low pass filtered version of the requested device layout defined by the patterning device PD (whether a mask in a mask-based system, or an array of individually controllable elements in a maskless system). Where the requested device layout contains sharp features (which contain infinitely high spatial frequency components), the dose pattern formed on the substrate W will be different from that defined by the patterning device PD because the higher spatial frequencies will be cut out. The low-pass threshold is defined by the properties of the projection system PS, and in general depends on the following three parameters: the radiation wavelength ($\lambda$), the numerical aperture of the projection optics (NA), and the size of the illuminator profile ($\sigma$). The smallest critical dimension (CD) that can be imaged is given by:

$$CD=0.25\lambda/NA(1+\sigma)$$

If not accounted for, the loss of high frequency information will cause errors in the device pattern formed after the exposed substrate W is processed, which it would be desirable to minimize or avoid.

In one example, low spatial frequency (i.e., low enough that they are not filtered out by the projection system PS) corrective features can be incorporated into the mask pattern. These could be features that do not correspond directly to particular elements of the requested device layout (i.e., they are not imaged as distinct features on the substrate W), but which act to correct for the low pass filtering effects of the projection system PS. These corrective features can be added by calculating the errors in the image expected for a given mask pattern and a given projection system PS due to the low pass filtering, and selecting corrective features accordingly. In one example, the corrective features are generally known by the name of "Optical Proximity Corrections" (OPCs). The corrections are needed more where small features and/or features in close proximity to each other are being imaged because the high frequency content of such features is more significant.

In a maskless system, therefore, the datapath hardware can use the requested device layout and/or OPCs as input. In a mask-based system the mask can be constructed on the basis of the requested device layout and OPCs.

Figure 5:
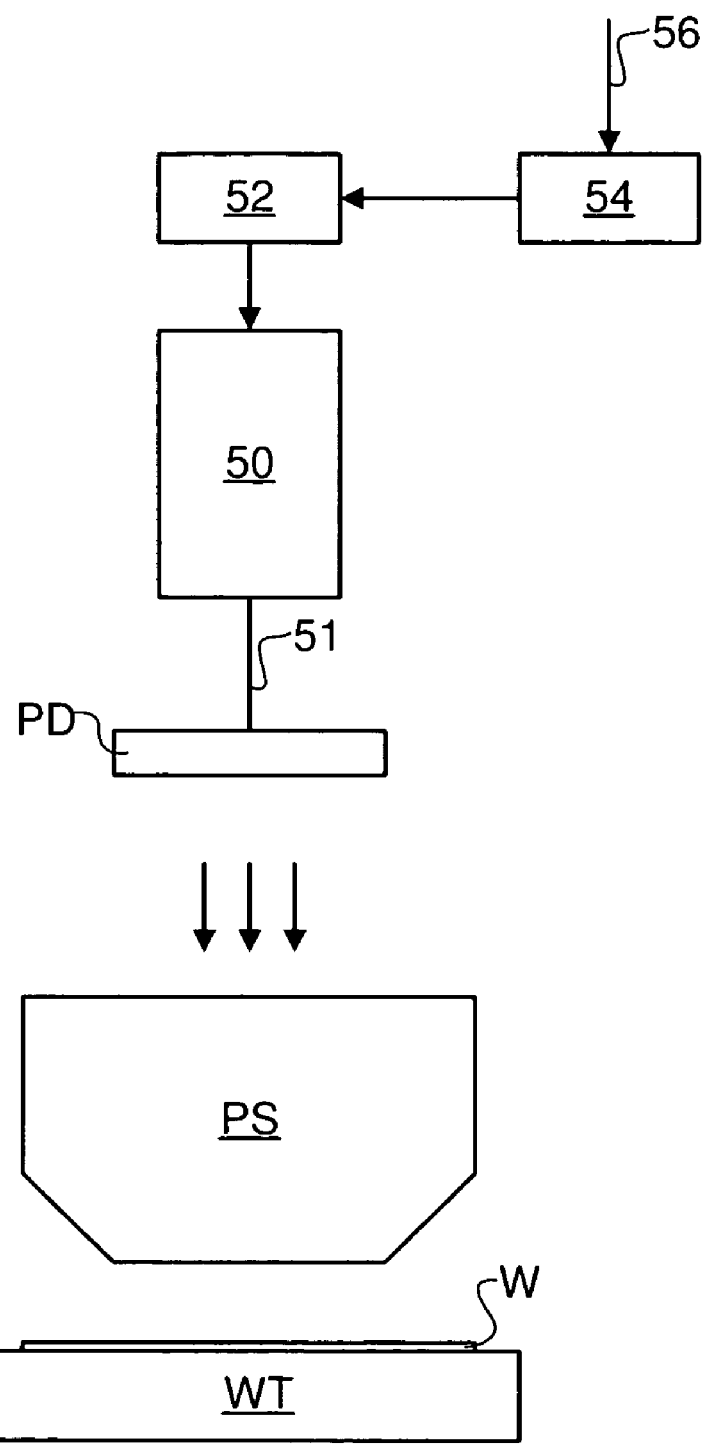
FIG. 5 depicts a lithographic system with datapath hardware and a conversion system.

FIG. 5 shows a maskless lithographic system. The apparatus comprises an array of individually controllable elements PD for modulating a radiation beam and a projection system PS for projecting the modulated radiation beam onto a substrate W in order to form a desired dose pattern. The array of individually controllable elements PD is controlled by a control signal 51 which is produced, in turn, by the datapath hardware 50. The calculations of the datapath hardware 50 are normally based on an input file 52 comprising a requested device layout, perhaps together with OPCs to correct for the bandwidth limitations of the projection system PS. In the present embodiment, a conversion system 54 is provided instead, which acts to convert the requested device layout (input via user interface 56) into a spatial-frequency-restricted representation (i.e., a representation that contains a limited range of spatial frequency components, e.g. a representation that is restricted to spatial frequencies below a certain threshold spatial frequency) of the requested device layout, which is then forwarded as input file 52 to the datapath hardware 50. In this way, the datapath hardware 50 receives an input file 52 representing a pattern that generally can be more closely produced on the substrate W by the projection system PS.

The conversion process can be designed to limit the spatial frequencies in the input file 52 to those that can be imaged by the projection system PS so that there is no loss of information.

The spatial-frequency-restricted representation can be generated so as to allow for the fact that higher spatial frequencies have not been included. For example, to include corrective features analogous to OPCs that do not correspond directly to visible features of the final device layout, but which help improve the resolution.

In one example, the conversion system 54 is configured to calculate a dose pattern that would be projected onto a substrate W by a mask-based lithographic apparatus using a mask PD designed to produce the requested device layout (i.e., to carry out a "virtual exposure" of the mask and calculate the results) and use the calculated dose pattern as input to the datapath hardware 50. Because the calculated dose pattern corresponds to a pattern that has already been low-pass filtered by a projection system PS, the calculated dose pattern is already a spatial-frequency-restricted representation of the requested device layout. Furthermore, if the projection system PS for the present maskless system has a resolution that is as good or better than that of the mask-based system, the dose pattern actually formed using the calculated dose pattern as input to the datapath hardware 50 will correspond closely to the dose pattern that would be formed by the mask-based system. Thus, this approach allows maskless systems to be used to evaluate quickly and accurately the performance of device layouts that will eventually be reproduced in mask-based systems.

An alternative or additional approach is to use a combination of the dose-to-clear contour. For example, the contour of the dose level corresponding to the "etching threshold" of the resist. The "etching threshold" being defined such that regions exposed with a dose lower than the etching threshold are removable by subsequent etching processing and regions exposed with a dose higher than the etching threshold are resistant to subsequent etching processing. A spatial derivative of the dose on the dose-to-clear contour is used as the spatial-frequency-restricted representation of the requested device layout. The spatial derivative of the dose is a measure of how the dose is changing at the contour. An example of a type of spatial derivative is the so-called Normalized Image Log Slope (NILS). A further example of a spatial derivative is the "resist profile," which can be calculated either before or after the post exposure bake. The "resist profile" is a measure of compositional (chemical) variations in the resist caused by exposure to imaging radiation in the region of the contour. The spatial derivative of the dose will in general be oriented perpendicular to the contour and will vary in magnitude along the contour.

Alternatively or additionally, a pixel map representation of the requested device layout can be used as the spatial-frequency-restricted representation. Any geometry of pixel map can in principle be suitable (e.g., hexagonal, square etc.) and can be constructed by sampling the requested device layout at a resolution high enough to be above the Nyquist frequency for the smallest spatial frequency that can be imaged by the projection system.

Although a pixel map can be formed at some stage in the normal datapath processing even when a non-spatial-frequency-restricted representation is used as input to the datapath hardware 50, this pixel map is formed iteratively as part of the online processing (at the same time as the substrate is being exposed), and is not provided as input to the datapath hardware 50. According to the one embodiment, the pixel map (or other spatial-frequency-restricted representation) is calculated externally (i.e., offline). Thus, this reduces the amount of work that has to be done online by the datapath, and potentially reduces hardware requirements and associated expense.

Figure 6:
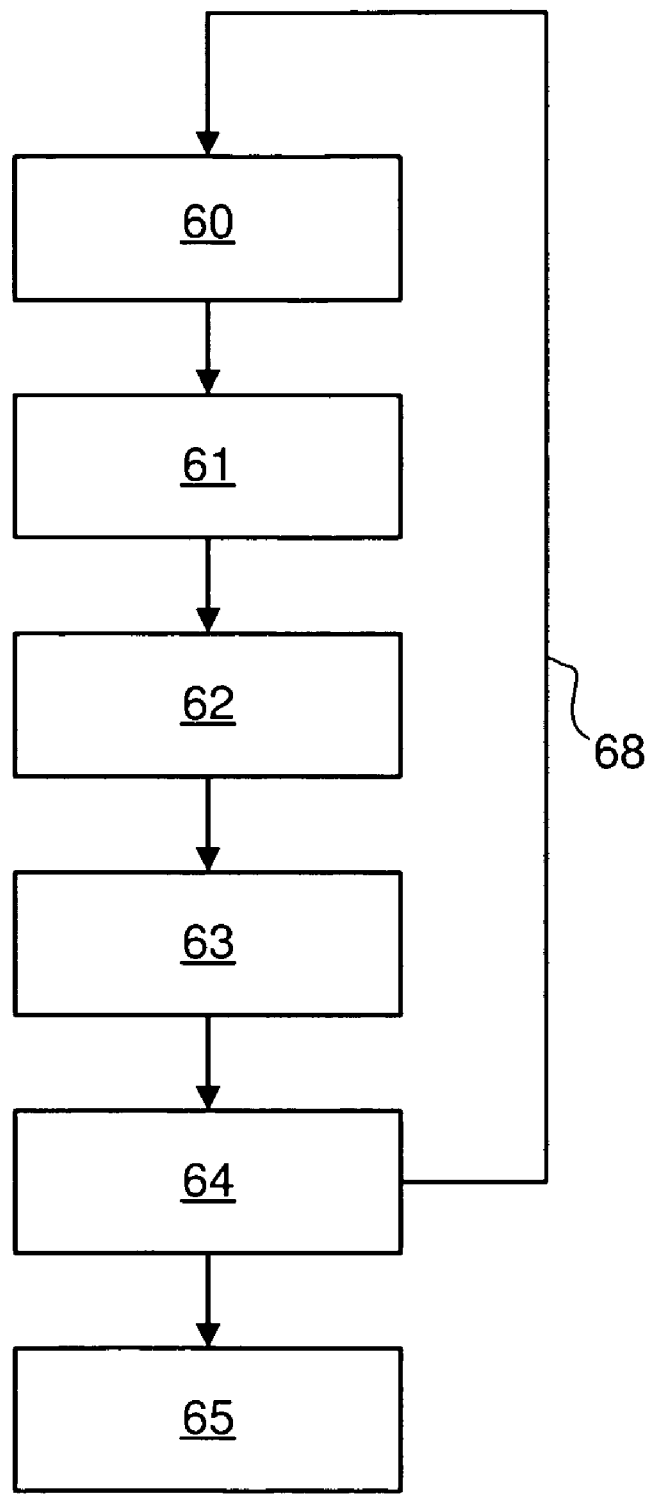
FIG. 6 depicts a mask optimization method.

FIG. 6 illustrates an example procedure for optimizing a mask layout. In step 60, a dose pattern to be projected onto a substrate in a mask-based system is calculated based on a virtual exposure of a mask having a candidate mask pattern. In step 61, the calculated dose pattern is used as input for datapath hardware in a maskless lithographic apparatus (which can have the same or a better optical performance than the mask-based system in question) in order to produce a control signal, and thereby control an array of individually controllable elements. In step 62, the controlled array of individually controllable elements is used to modulate a radiation beam, which is projected onto a substrate in order to expose the substrate. In step 63, the fully exposed substrate is processed in order to form an at least partially functional device. The properties of the device are then tested in step 64 to evaluate the performance of the device layout corresponding to the candidate mask pattern.

In one example, the above steps can be repeated for various different candidate patterns (each pattern being exposed on the same substrate or on different substrates) before the results are passed to a comparison stage 65, in which the results are compared and an optimal candidate mask pattern can be selected.

As discussed above, the use of a maskless system enables these tests to be carried out relatively quickly and cheaply because it is not necessary to fabricate a mask corresponding to each of the candidate mask patterns. In addition, because the calculated dose pattern from a mask with the candidate pattern is used as input rather than the requested layout, there should be a relatively closer correlation between the results achieved for a given candidate mask pattern in the maskless system and the results achieved when that candidate mask pattern is used to fabricate a mask and that mask is used in a mask-based lithographic system. The results of the above testing procedure are therefore more reliable than where testing is carried out using a requested device layout as direct input for the datapath hardware.

The above optimization procedure was based on using the results of a virtual exposure of a mask as a spatial-frequency-limited input for a maskless lithography system. The method could be adapted to use other forms of spatial-frequency-limited representations of the pattern on the mask. For example, the candidate mask pattern can be represented as a combination of a dose-to-clear contour and a spatial derivative of the dose along the dose-to-clear contour instead of being virtually exposed in order to obtain the spatial-frequency-limited representation.

Various properties of the device layout can affect performance. For example, cross-talk between different device elements, variations in communication line lengths (which cause delays), and variations in transistor gate over length quotients. Significant variations in electrical performance are seen between different device layout patterns even when they are designed to have nominally the same functionality. These variations are often difficult to predict at the design stage, which is why testing is beneficial.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic system, comprising:
a patterning device configured to modulate a radiation beam;
a projection system configured to project the modulated radiation beam onto a target portion of a substrate;
datapath hardware configured to convert an input pattern file into a control signal that is used to control the patterning device; and
a conversion system configured to convert a requested device layout pattern into a spatial-frequency-restricted representation of the requested device layout pattern, as the input pattern file for the datapath hardware, wherein the spatial-frequency-restricted representation includes limited range of spatial-frequencies below a threshold;
wherein the threshold is determined by the spatial frequencies configured to be imaged by the projection system.

2. The lithographic system of claim 1, wherein the spatial-frequency-restricted representation only includes the spatial-frequencies configured to be imaged by the projection system.

3. The lithographic system of claim 2, wherein the spatial-frequency-restricted representation comprises portions that correct for the absence of spatial frequencies that cannot be imaged by the projection system.

4. The lithographic system of claim 1, wherein:
the patterning device comprises a mask configured to produce the requested device layout pattern; and
the conversion system is configured to calculate a dose pattern that is projected onto the substrate by the mask and to use the calculated dose pattern as the spatial-frequency-restricted representation.

5. The lithographic system of claim 4, wherein the mask comprises optical proximity corrections.

6. The lithographic system of claim 1, wherein the spatial-frequency-restricted representation generated by the conversion system comprises a map of a dose-to-clear contour in combination with information about at least one type of spatial derivative of the dose along the dose-to-clear contour.

7. The lithographic system of claim 6, wherein the information about at least one type of spatial derivative of the dose along the dose-to-clear contour comprises a Normalized Image Log Slope or a resist profile.

8. The lithographic system of claim 1, wherein the spatial-frequency-restricted representation generated by the conversion system comprises a pixel map representation of the requested device layout pattern.

9. A device manufacturing method, comprising:
modulating a radiation beam using a patterning device;
projecting the modulated radiation beam onto a target portion of a substrate using a projection system;
converting an input pattern file into a control signal for controlling the patterning device using datapath hardware;
converting a requested device layout pattern into a spatial-frequency-restricted representation of the requested device layout pattern, wherein the spatial frequency-restricted representation includes limited range of spatial-frequencies below a threshold; and
using the spatial-frequency-restricted representation of the requested device layout pattern as the input pattern file for the datapath hardware;
wherein the threshold is determined by the spatial frequencies that are imagable by the projection system.

10. The method of claim 9, wherein the spatial-frequency-restricted representation only includes the spatial-frequencies imagable by the projection system.

11. The method of claim 10, wherein the spatial-frequency-restricted representation is generated to include portions that correct for the absence of spatial frequencies that are not imagable by the projection system.

12. The method of claim 9, wherein the converting of the requested device layout pattern into the spatial-frequency-restricted representation comprises:
using a mask as the patterning device;
calculating a dose pattern for the mask that is designed to produce the requested device layout pattern; and
using the calculated dose pattern as the spatial-frequency-restricted representation.

13. The method of claim 12, further comprising forming optical proximity corrections on the mask.

14. The method of claim 9, wherein the converting step produces a spatial-frequency-restricted representation comprising a map of a dose-to-clear contour in combination with information about at least one type of spatial derivative of the dose along the dose-to-clear contour.

15. The method of claim 14, wherein the information about at least one type of spatial derivative of the dose along the dose-to-clear contour comprises a Normalized Image Log Slope or a resist profile.

16. The method of claim 9, wherein the converting step produces a spatial-frequency-restricted representation comprising a pixel map representation of the requested device layout pattern.

17. A flat panel display manufactured according to the method of claim 9.

18. An integrated circuit device manufactured according to the method of claim 9.

* * * * *